United States Patent
Mitros

(10) Patent No.: US 7,045,425 B2
(45) Date of Patent: May 16, 2006

(54) BIRD'S BEAK-LESS OR STI-LESS OTP EPROM

(75) Inventor: Jozef Czeslaw Mitros, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 85 days.

(21) Appl. No.: 10/880,872

(22) Filed: Jun. 30, 2004

(65) Prior Publication Data

US 2006/0003527 A1    Jan. 5, 2006

(51) Int. Cl.
  *H01L 21/336*    (2006.01)
(52) U.S. Cl. ...................... 438/264; 438/296
(58) Field of Classification Search ............. 438/264, 438/296
  See application file for complete search history.

(56) References Cited

U.S. PATENT DOCUMENTS

| 5,394,101 | A   |   | 2/1995  | Mitros |
| 6,222,227 | B1  | * | 4/2001  | Chen .................. 257/316 |
| 6,313,011 | B1  |   | 11/2001 | Nouri |
| 6,597,026 | B1  | * | 7/2003  | Ogura ................. 257/287 |
| 6,667,224 | B1  |   | 12/2003 | Watt et al. |

* cited by examiner

*Primary Examiner*—Chandra Chaudhari
(74) *Attorney, Agent, or Firm*—Rose Alyssa Keagy; W. James Brady, III; Frederick J. Telecky, Jr.

(57) ABSTRACT

The present invention facilitates semiconductor fabrication by maintaining uniform thickness of a gate oxide layer (112) during the oxide growth process of non-volatile memory devices (100). The uniform thickness of a gate oxide layer (112) is obtained by defining the boundaries of the source and drain areas (110) of a memory device (100) with the source/drain dopant masking and implanting operation. If an isolation barrier (108) is present it is kept a minimum safe distance (130) away from the periphery of the conductive gate layer (114) to avoid birds-beak regions (30) responsible for non-uniform gate oxide growth. As a result, the corresponding charge losses and weak cells are mitigated, thereby facilitating the fabrication of more reliable memory cells (100). Because a more uniform gate oxide thickness (112) is used in association with the memory cells (100), a single significantly thinner gate oxide layer (114) may be employed throughout the memory device (100). In this way, the same gate oxide layer (114) may be used by an NVM device (100) embedded with common CMOS devices to reduce wafer manufacturing costs.

20 Claims, 11 Drawing Sheets

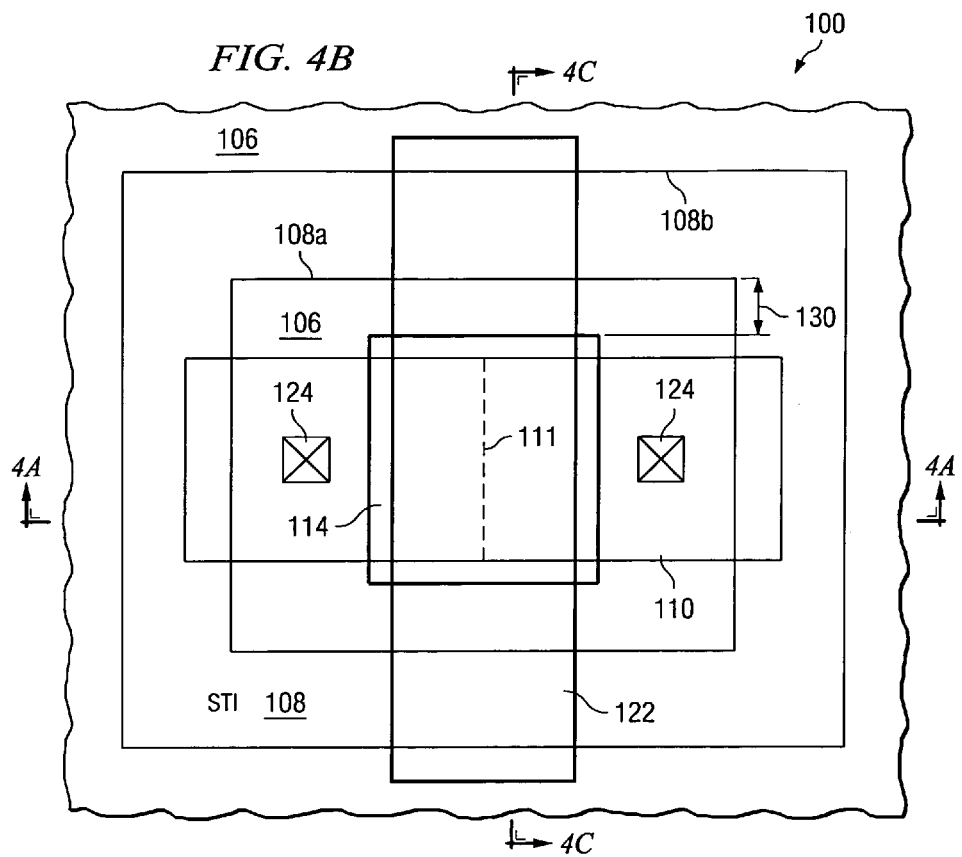
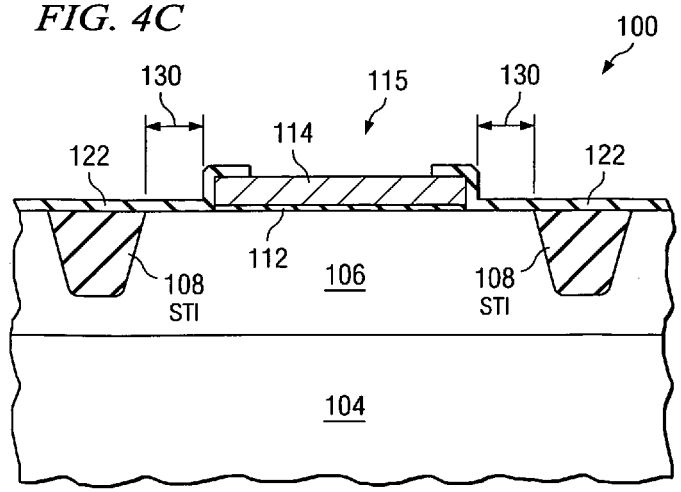

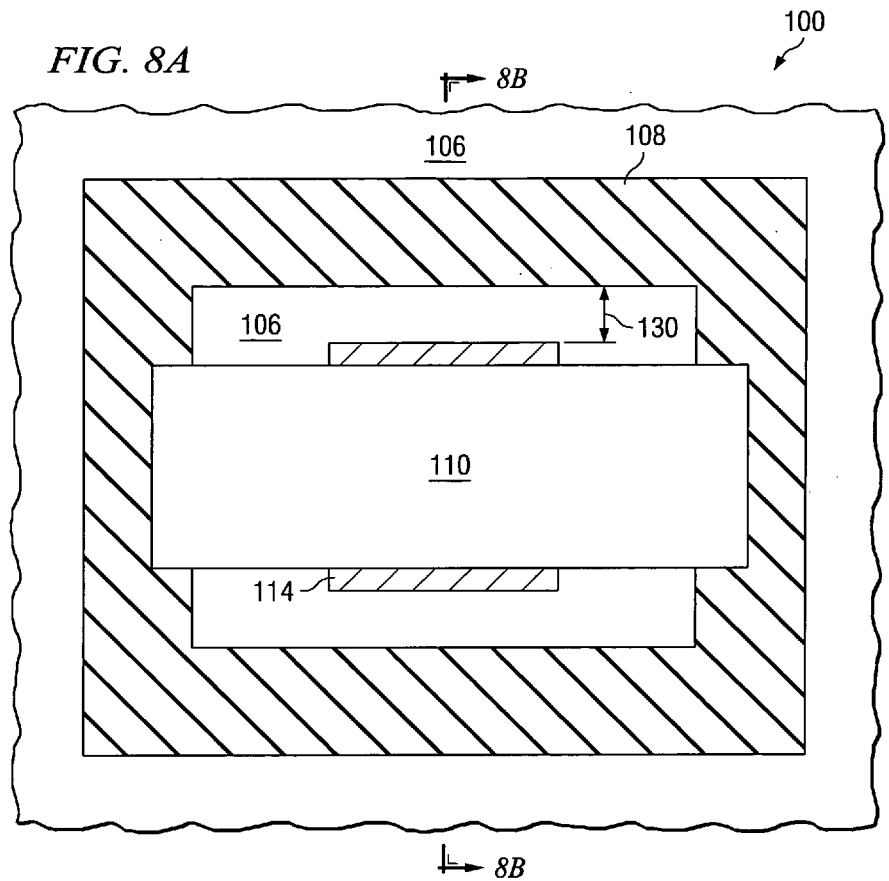
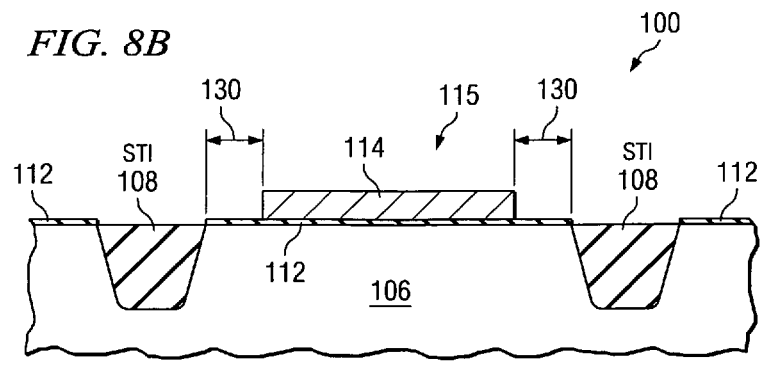

| | OTP EPROM WITH STI | | | OTP EPROM WITHOUT STI | | |
|---|---|---|---|---|---|---|
| L (μm) | 0.6 | 0.7 | 0.8 | 0.6 | 0.7 | 0.8 |
| W (μm) | 1.1 | 1.1 | 1.1 | 1.1 | 1.1 | 1.1 |
| IOFF @ 1V (μA) | -1.3E-07 | -2.3E-08 | -7.1E-08 | -1.1E-07 | -3.6E-08 | -4.1E-07 |
| IOFF @ 2V (μA) | -3.2E-06 | -4.3E-06 | -8.7E-07 | -5.5E-05 | -2.1E-05 | -4.6E-05 |
| ION @ 10μs (μA) | -62.8 | -56.2 | -48.5 | -79.9 | -70.9 | -64.8 |
| ION @ 100μs (μA) | -69.8 | -62.7 | -54.4 | -90.0 | -80.2 | -72.3 |
| ION @ 1ms (μA) | -74.9 | -67.1 | -58.4 | -96.9 | -86.3 | -77.5 |
| IPROGR @ 7V (μA) | -361.7 | -289.9 | -241.6 | -448.5 | -369.4 | -310.6 |

ION=IDS (VDS=-1V) OF OTP EPROM PROGRAMMED USING
VDS=-7V APPLIED FOR SPECIFIED TIME

BIRD'S BEAK-LESS OR STI-LESS OTP EPROM

FIELD OF THE INVENTION

The present invention relates generally to semiconductor device fabrication, and more particularly, systems and methods for mitigating non-uniform oxide growth thinning that results in memory cell charge loss and to provide more reliable lower cost memory devices.

BACKGROUND OF THE INVENTION

Semiconductor device fabrication involves using a number of fabrication processes to build a desired device. Generally, a semiconductor device is fabricated on a semiconductor material referred to as a substrate by forming layers or components, selectively patterning formed layers, and selectively implanting dopants into layers and/or the substrate in order to achieve desired operational characteristics.

Several common methods and structures have been used to isolate areas on semiconductor devices and to define the boundaries of certain active regions in the substrate. Such structures that are fabricated in semiconductor devices may include a local oxidation of silicon (LOCOS) region, or a shallow trench isolation (STI) region formed in a substrate as illustrated in prior art FIGS. 2 and 3, respectively. Both LOCOS and STI regions serve to electrically isolate multiple active devices (e.g., transistors) so that they do not interfere with each other's operations. LOCOS and STI are commonly used in CMOS silicon technology.

Generally, an STI region, for example, is formed in/on a device by selectively etching a shallow trench between components or devices, filling the shallow trench with oxide, and then planarizing the device to substantially remove portions of the fill oxide from a surface of the device while leaving the fill oxide within the etched shallow trench.

A typical formation of an STI region employs forming a pad oxide and an etch stop layer prior to etching the shallow trench. The etch stop layer is selectively formed (deposited and patterned) in non-trench regions and is comprised of a material, such as nitride, that is substantially resistant to a planarization process being employed. A trench oxide fill process is then performed that deposits oxide into the shallow trenches followed by the planarization process. A high quality gate oxide layer is then typically grown over active regions using a thermal oxidation process. However, near the edges of the STI or LOCOS regions referred to as bird's-beak areas, a non-uniform local thinning of the oxide growth (reduced oxide growth rate) can occur corresponding to local alterations produced in the silicon crystal lattice structure. This non-uniform gate oxide thinning causes a percentage of the memory cells to lose charge faster than other cells of the array resulting in weak or unreliable transistor devices.

Accordingly, what is needed are systems and methods that mitigate non-uniform gate oxide growth thinning and facilitates more reliable and lower cost memory device fabrication.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by maintaining uniform thickness of a gate oxide layer during the oxide growth process in the fabrication of a non-volatile memory (NVM) device (e.g., an OTP EPROM). The uniform thickness of a gate oxide layer is maintained by defining the boundaries of the source, drain, and channel areas of a memory device with a masking and implanting process or step employing a p-type source/drain dopant (PSD) for a p-MOS device, or n-type source/drain dopant (NSD) for an n-MOS device. For example, the PSD pattern and implant in an n-well active region defines the source/drain regions of a p-MOS device, while the NSD pattern and implant in a p-well active region defines the source/drain regions of a n-MOS device. Herein, the PSD source/drain dopant implant type may also be referred to as a first conductivity type, while the NSD source/drain dopant implant type may be referred to as a second conductivity type.

Traditional devices, by contrast, use the isolation barrier (e.g., an STI or LOCOS isolation structure) to define the source/drain boundaries. However, as discussed, the interface between these isolation barriers and the active regions tend to produce birds-beak regions that cause a non-uniform local thinning in the subsequent growth of the gate oxide layer. This local gate oxide thinning results in cell charge loss, weak or otherwise unreliable memory cells.

The PSD/NSD implant of the present invention comprises selectively patterning a mask and implanting a p+ type or n+ type material, respectively, into the defined source and drain regions, whereby the PSD/NSD implant defines the boundaries of the source and drain (S/D) regions.

In accordance with an aspect of the present invention, the isolation barrier is kept a minimum safe distance away from the periphery of the polysilicon gate layer to avoid the birds-beak regions that are responsible for the non-uniform oxide growth. As a result, the corresponding charge losses and weak cells are mitigated, thereby facilitating the fabrication of more reliable OTP memory cells. Because a more uniform gate oxide thickness is maintained in association with the memory cells, a single significantly thinner gate oxide layer may be employed for the memory device. In this way, the same gate oxide layer may be used by an NVM device embedded with common CMOS devices to reduce wafer manufacturing costs.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 4A–4C are cross sectional front, top plan, and cross sectional side views, respectively, of an exemplary semiconductor memory device at a later stage of fabrication in accordance with an aspect of the present invention.

FIGS. 8A and 8B are top plan, and cross sectional side views, respectively, of the exemplary memory device of FIGS. 4A–4C after patterning and implanting a source/drain dopant to define the source, drain, and channel regions.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Conventional memory devices use an isolation barrier (e.g., an STI or LOCOS isolation structure) to isolate various elements of a semiconductor device and to define the boundaries of certain active regions in the substrate. Conventionally, however, the interface between these isolation structures and the active regions tend to produce birds-beak type regions that cause a non-uniform local thinning in the subsequent growth of a gate oxide layer. As a result, memory cells may experience a charge loss, yielding weak or unreliable performance.

Some previous solutions to avoid this charge loss have been proposed and include thicker gate oxide layers, or multiple gate layer thicknesses. However, these solutions yield more expensive and more complex wafer fabrication processes. Additionally, a thicker gate oxide layer decreases the effective level of control by the gate.

The present invention facilitates semiconductor fabrication by maintaining a spatially uniform thickness of a gate oxide layer during the oxide growth process in the fabrication of an OTP EPROM non-volatile memory (NVM) device. A uniform gate oxide thickness is obtained by defining the source, drain, and channel regions of the memory device with the NSD/PSD dopant mask and implant, and by maintaining a minimum distance of the above regions from the isolation structures (where the oxide thinning may occur). As a result, NVM devices can be fabricated to significantly thinner gate oxide dimensions than could be otherwise.

Figure 1A:
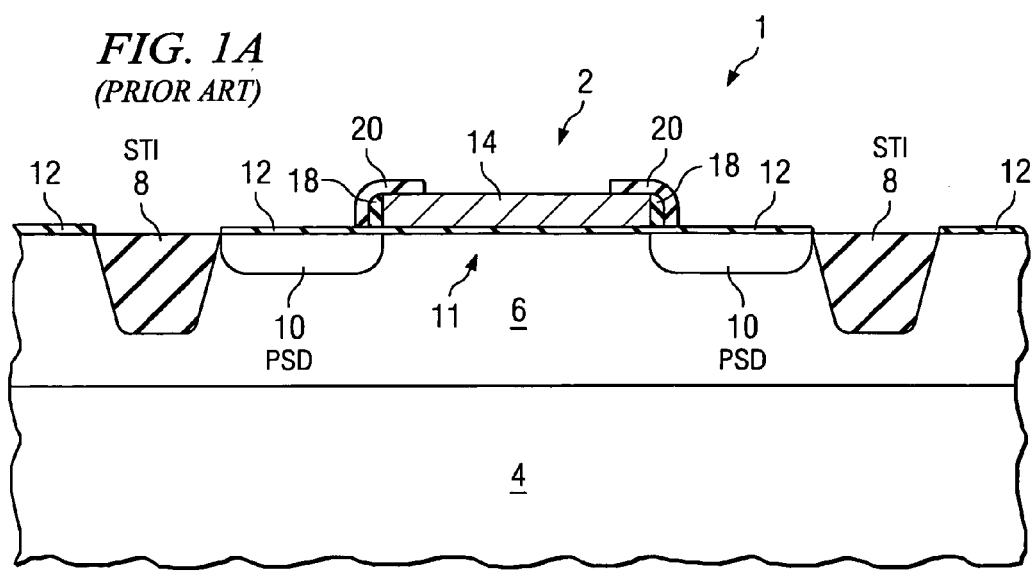
FIGS. 1A–1C are cross sectional front, top plan, and cross sectional side views, respectively, of a prior art semiconductor memory device at a stage of fabrication utilizing the isolation barrier to define the source, drain, and channel regions of the device.
Figure 1B:
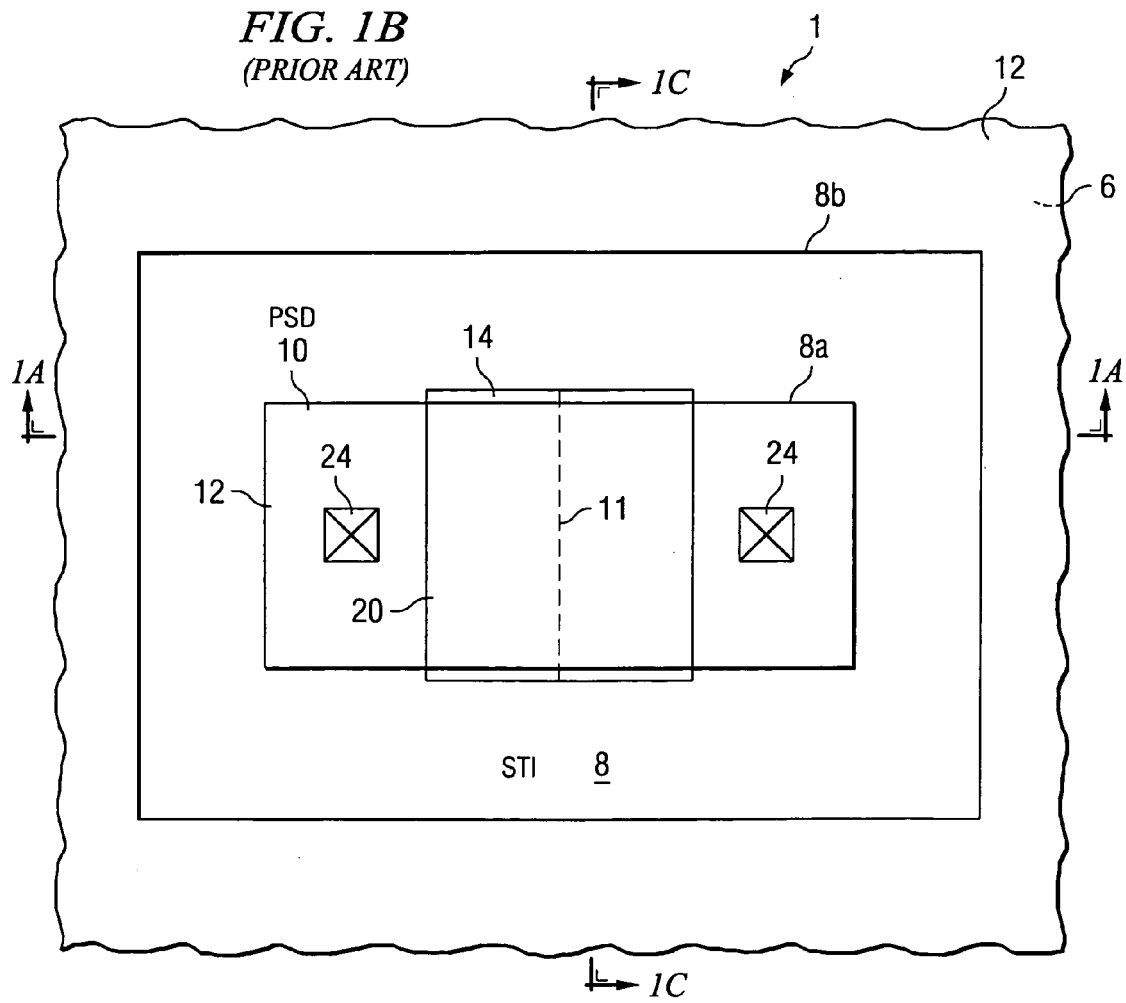
Figure 1C:
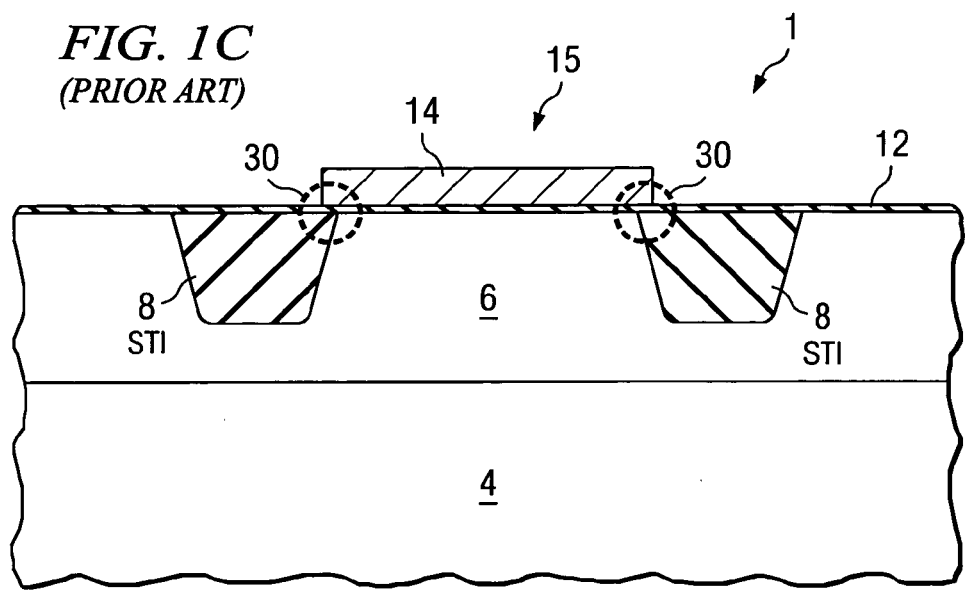

FIGS. 1A–1C illustrate cross sectional front, top plan, and cross sectional side views, respectively, of a prior art semiconductor memory device 1. Memory device 1 comprises a PMOS OTP EPROM transistor 2 fabricated overlying a p+ substrate 4 within an n-well 6. Prior art device 1 is shown at a stage of fabrication wherein an isolation structure or barrier 8 is utilized to define the outermost boundaries of the active source/drain (S/D) regions 10 (PSD for a PMOS device in the example), and a channel region 11 formed therebetween. Device 1 is also shown having a gate oxide layer 12 that is generally selectively grown by a thermal oxidation process overlying the non-isolation barrier areas.

Prior art device 1 further has a polysilicon gate layer 14 overlying a portion of the active source/drain regions 10 and the gate oxide layer 12. A Polysilicon gate layer 14 is formed over the gate oxide layer 12, and sidewall spacers 18 and 20 insulate the sidewalls of the gate 14 and aid in shaping subsequent source and drain implant operations. Formation of conductive contact pads 24 permit electrical connections to the S/D regions 10.

It should be noted that in the prior art device 1 of FIGS. 1A–1C, the inner boundary 8a of the STI structure 8 defines the outermost boundary of the PSD or S/D regions 10. As a result, a problematic birds-beak or reduced oxide growth area 30 may occur in such a prior art memory device 1 at the interface boundary between the active S/D regions 10 and the isolation structure 8. In particular, this becomes a problem where the gate oxide layer 12 and the polysilicon gate layer 14 (the gate stack area 15) overly this interface boundary in the birds-beak area 30 exhibits a reduced thickness due to non-uniform gate oxide growth.

Figure 2:
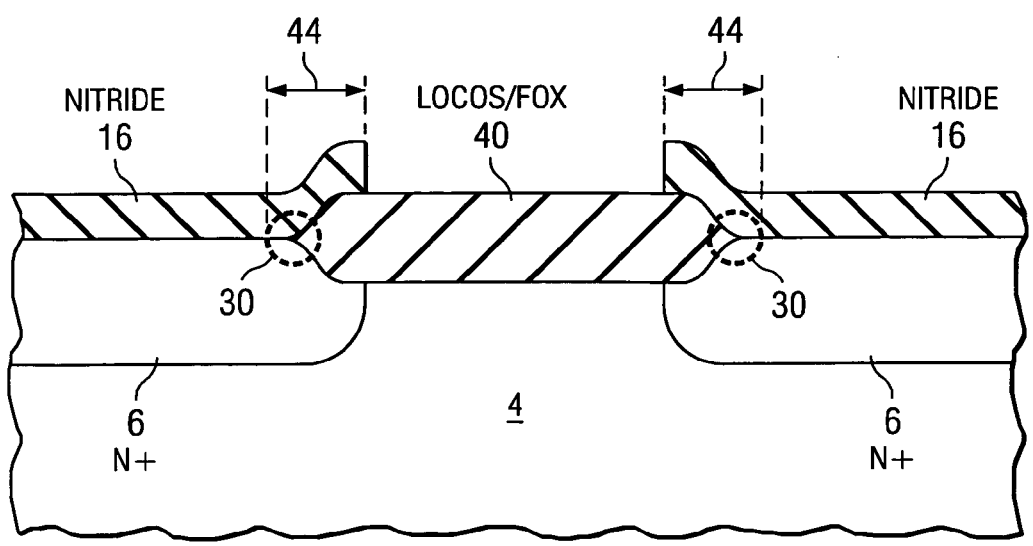
FIG. 2 is a cross sectional view of a conventional isolation structure employing a local oxidation of silicon (LOCOS) region and a birds-beak region that can occur when formed in a semiconductor substrate.
Figure 3:
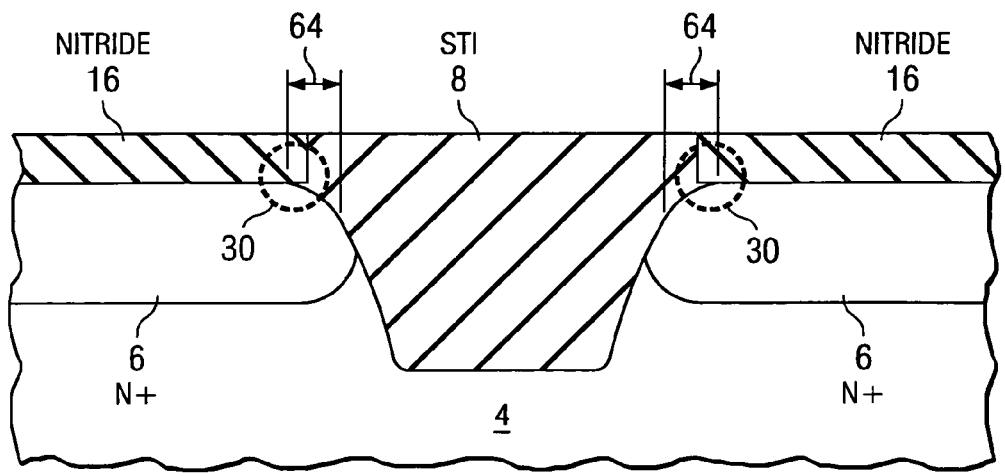
FIG. 3 is a cross sectional view of another conventional isolation structure employing a shallow trench isolation (STI) region and a reduced oxide growth region that can occur when formed in a semiconductor substrate.

FIGS. 2 and 3, for example, illustrate a more detailed view of the birds-beak or reduced oxide growth area 30 that may occur to varying extents in either the LOCOS/FOX isolation structure 40 or STI isolation structure 8, respectively, in association with the memory device 1. Although, the length of the birds beak area 44 in the LOCOS/FOX isolation structure 40 may be somewhat different than that of the area 64 in the STI isolation structure 8, both structures have a tendency to cause non-uniform gate oxide growth, due in some part to a rounding of the silicon at the interface impacting the silicon crystal lattice structure. As indicated, the non-uniform gate oxide growth occurs in association with the area 30 at the interface boundary between the gate stack area 15 of active regions 10 and the isolation structure 8, as illustrated in FIG. 1C.

Accordingly, the inventor has appreciated that a method was needed to isolate the gate stack area 15 of active regions 10 from the isolation structure 8 so that the gate 15 avoids the interface boundary. The inventor has further realized that such goals may be attained by physically separating the gate stack area 15 and the isolation structure 8 in accordance with the present invention illustrated hereinafter.

Figure 4A:
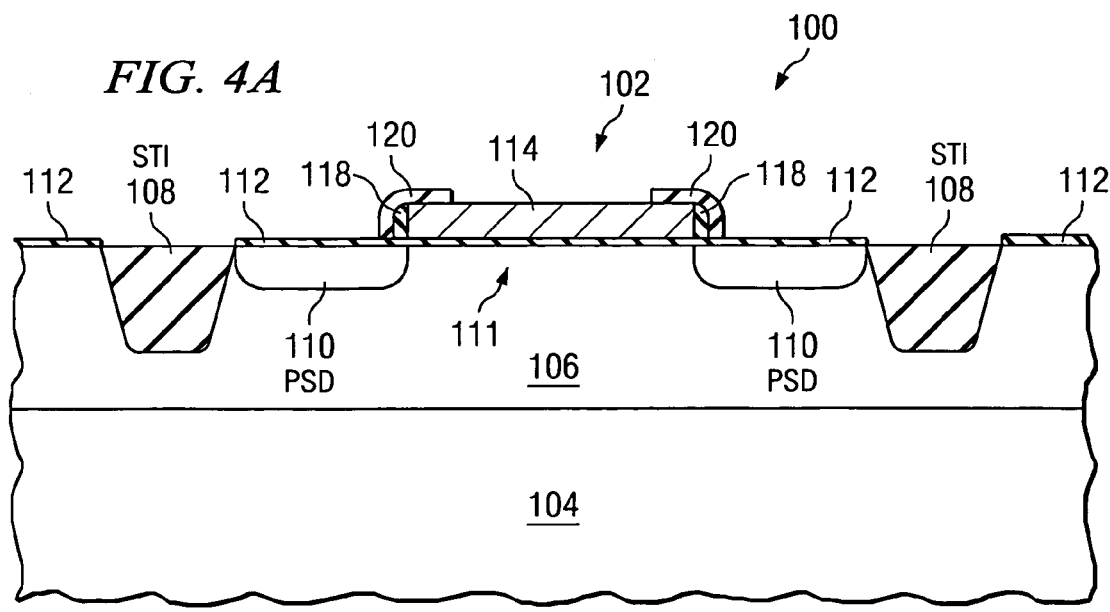

FIGS. 4A–4C, for example, illustrate cross sectional front, top plan, and cross sectional side views, respectively, of a later stage of fabrication of an exemplary semiconductor memory device 100 (e.g., a memory cell) fabricated in accordance with the method of the present invention. Memory device 100 comprises, for example, a PMOS OTP EPROM transistor 102 fabricated overlying a p+ substrate 104 within an n-well 106. Transistor 102 is electrically isolated from other such devices by an isolation structure or barrier 108 (e.g., LOCOS or STI) located generally outside the periphery of the transistor 102. Memory device 100 is shown at a stage of fabrication wherein a PSD/NSD source/drain (S/D) patterning and implant step or operation (PSD for a PMOS device in the example, or NSD for an NMOS device) is utilized to define the outermost boundaries of the active source/drain (S/D) regions 110, and a channel region 111 formed therebetween. Device 100 is also shown having a gate oxide layer 112 that is selectively grown by a thermal oxidation process overlying the non-isolation barrier areas.

Memory device 100 further has a polysilicon gate layer 114 overlying a portion of the active region 110 and the gate oxide layer 112. Polysilicon gate layer 114 is formed over the gate oxide layer 112, comprising a gate stack area 115. Sidewall spacers 118 and 120 insulate the sidewalls of the gate 114 and aid in shaping subsequent source and drain implant operations. Optionally, a silicide block layer SIBLK 122 may be utilized (e.g., via patterning and etching) to cover part or all of the active areas to prevent leakage between the source and drain regions 110 after silicidation. Finally conductive contact pads 124 are formed over the S/D regions 110 to permit electrical connections to the memory device 100.

It should be noted, in accordance with the present invention and memory device 100 of FIGS. 4A–4C, the inner boundary 108a of the STI structure 108 is no longer employed to define the boundary of the active S/D regions 110 of device 100. In particular, the inner boundary 108a of the STI isolation structure 108 is spaced a minimum distance 130 away from the gate stack area 115 of transistor 102 to avoid a problematic birds-beak area from being formed where the gate 114 is formed over the thermally grown gate oxide layer 112. As a result, the gate oxide layer 112 may be grown substantially uniformly at all portions spatially under the gate without the influence of a birds-beak area threat, thereby minimizing memory device (e.g., memory cell) 100 charge loss. Further, because the gate oxide layer 112 may be grown more uniformly, it may be fabricated significantly thinner than with a prior art method, enabling the fabrication of an NVM device embedded with conventional CMOS devices using the thinner gate oxide layer, while reducing wafer cost. Note that the present invention does not prevent the formation of a non-uniform oxide, but rather defines the source/drain and poly regions to avoid their deleterious impact.

Figure 5:
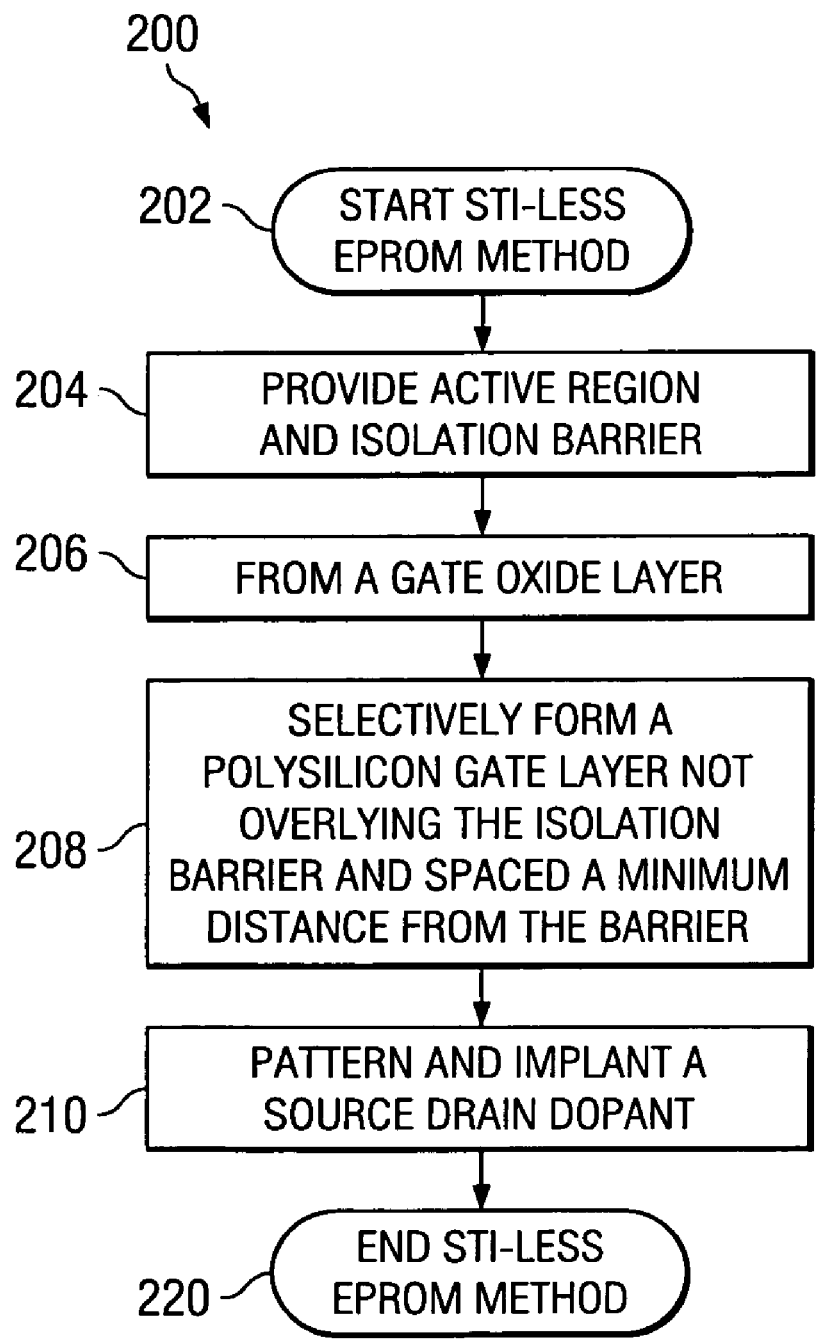
FIG. 5 is a flow diagram illustrating a method 200 of forming an STI-less non-volatile memory in accordance with an aspect of the present invention.

FIG. 5 illustrates a flow diagram of a method 200 of fabricating an exemplary semiconductor device that maintains a uniform thickness of a gate oxide layer during the oxide growth process in the fabrication of a non-volatile memory device. It will be appreciated that although the methodology 200 is illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

The method 200 defines the source, drain, and channel regions of the memory device with an NSD/PSD dopant mask and implant, and avoids the inclusion of birds-beak regions responsible for non-uniform gate oxide growth by maintaining a minimum distance between the gate stack and the isolation structures. The method 200 is described in conjunction with FIGS. 6A and 6B thru 9A and 9B, which serve to illustrate top plan, and cross sectional side views, respectively, of the exemplary semiconductor memory device 100 of FIGS. 4A–C at various stages of fabrication.

Figure 6A:
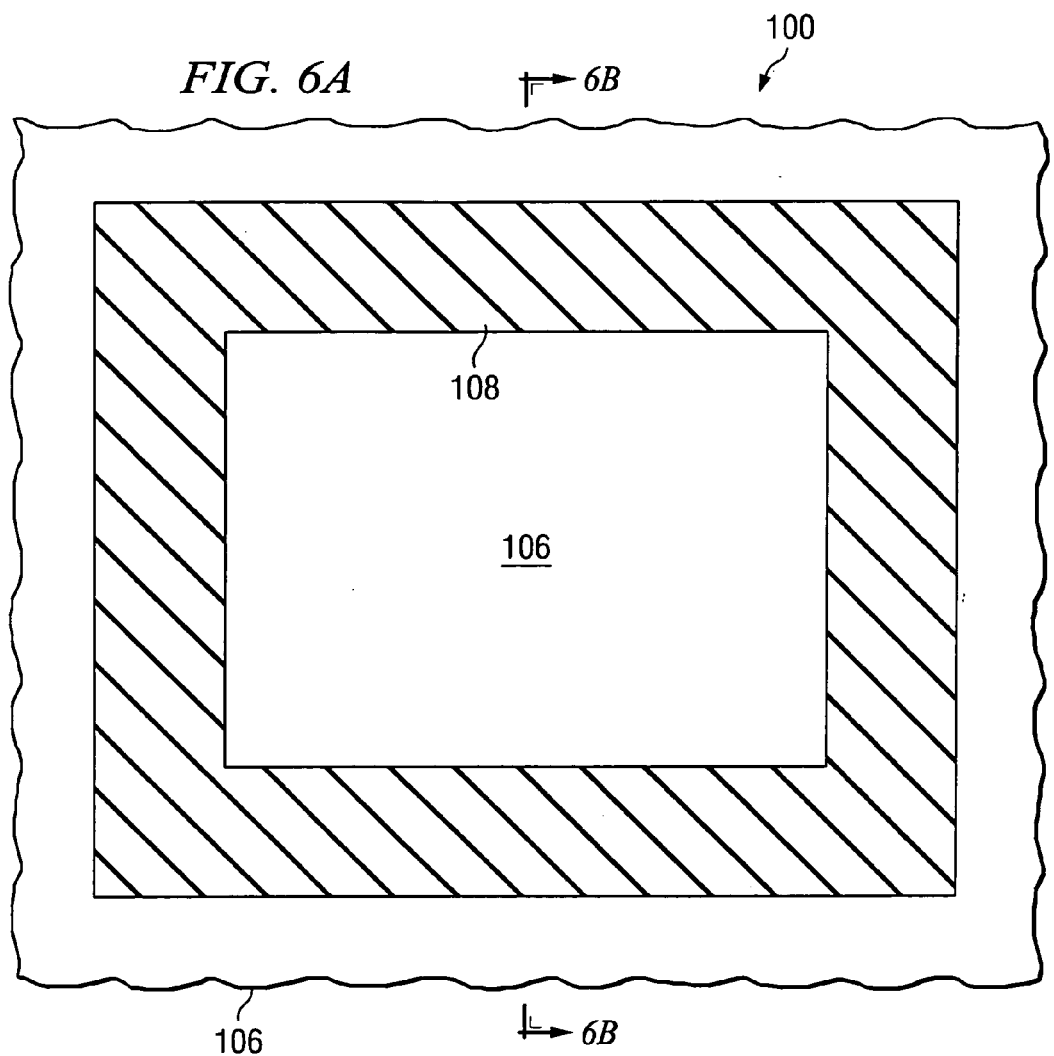
FIGS. 6A and 6B are top plan, and cross sectional side views, respectively, of the exemplary memory device of FIGS. 4A–4C after an initial stage of fabrication of providing an active region and an isolation barrier in a substrate.
Figure 6B:
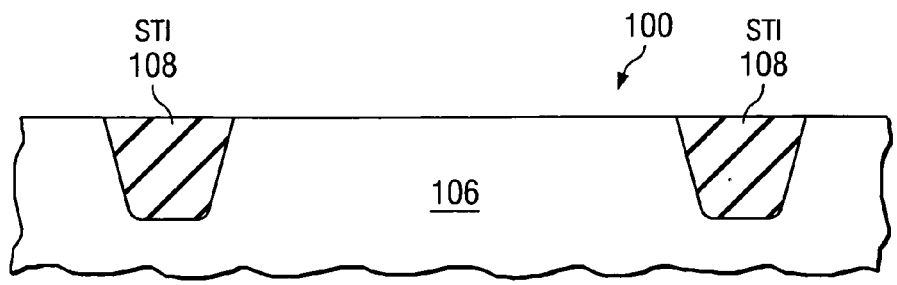

The method 200 begins at block 202 wherein at 204 an isolation structure or barrier 108 is formed on a semiconductor p-type substrate 104 within an n-well 106 as illustrated in FIGS. 6A and 6B in accordance with the present invention. The shallow isolation trench STI 108 or a LOCOS isolation structure may be formed to a suitable thickness to electrically isolate one or more such semiconductor devices 100 and provide an isolation region, which will later contain the active regions of the device 100. For example, such an isolation structure may be formed comprising a pad oxide layer and an overlying etch stop layer formed, for example, of silicon nitride on the pad oxide layer that is employed to facilitate planarization after trench filling with an insulative oxide deposition. In accordance with the present invention, the isolation structure 108 should provide adequate spacing allowance around the memory device to facilitate the minimum spacing described supra, thereby preventing a birds-beak area near a gate stack subsequently formed.

Figure 7A:
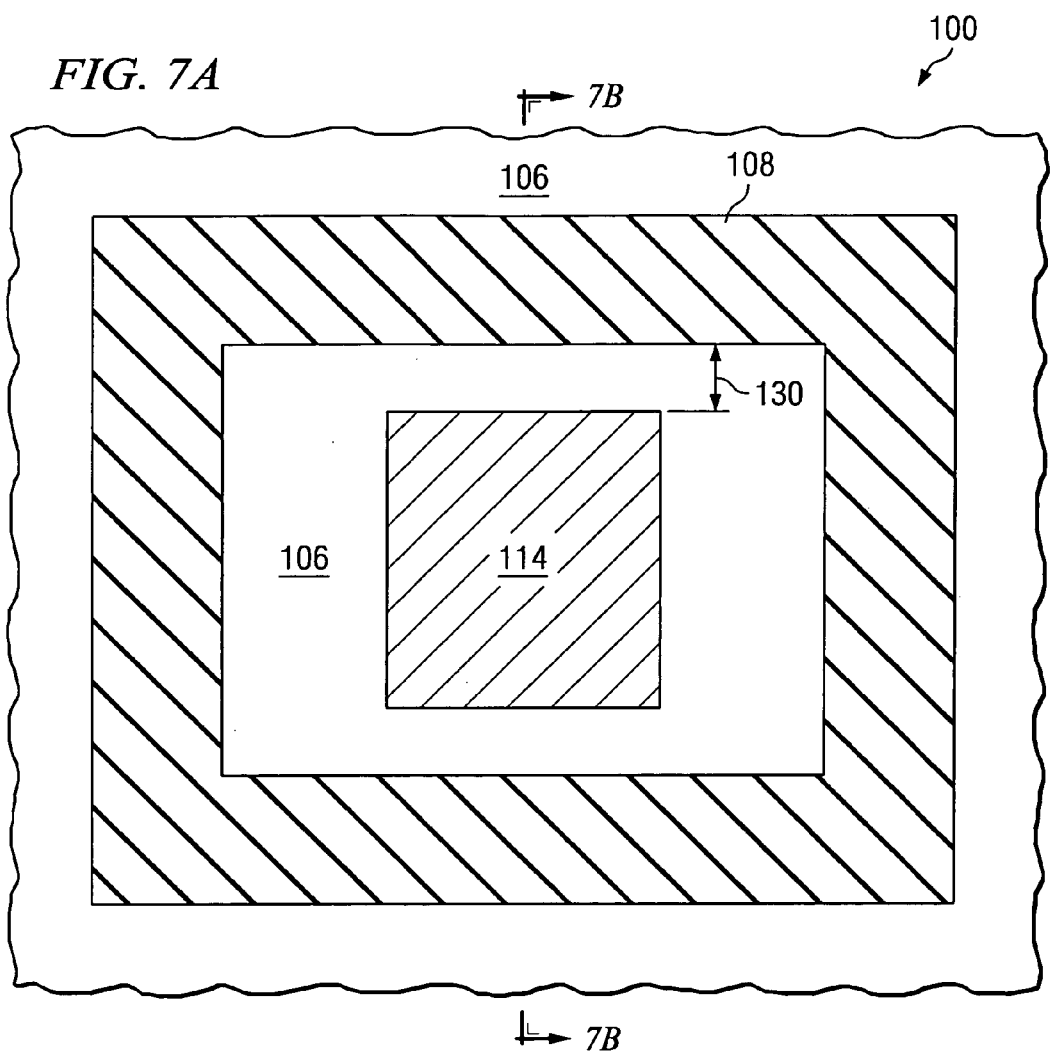
FIGS. 7A and 7B are top plan, and cross sectional side views, respectively, of the exemplary memory device of FIGS. 4A–4C after another stage of fabrication of forming a gate oxide layer and a polysilicon gate layer.
Figure 7B:
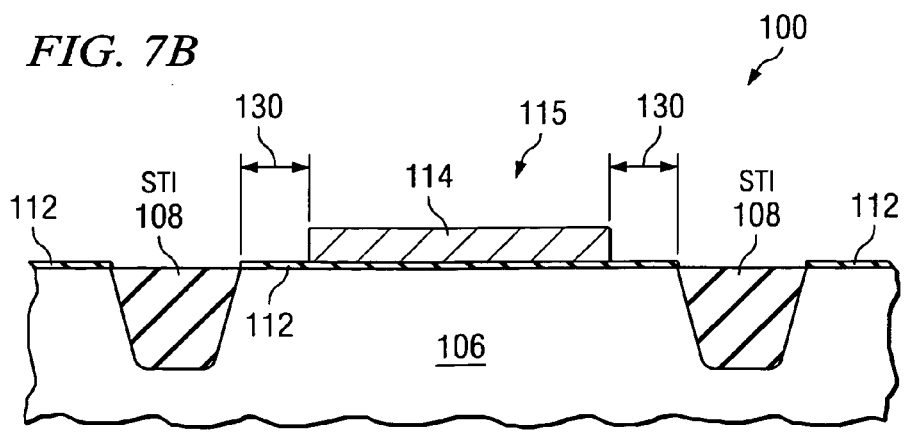

Returning to method 200, at 206 a high quality gate oxide layer 112 (and optional nitride layer 116) is formed over the n-well 106 areas and non-trench or non-isolation structure areas as illustrated in FIGS. 7A and 7B. A number of suitable techniques can be employed to form the gate oxide layer 112. One technique is to grow the gate oxide to a suitable thickness by a thermal oxide growth process when the semiconductor substrate is comprised of silicon. It is appreciated that other suitable deposition techniques can be employed in accordance with the present invention.

Continuing on with method 200, a polysilicon gate layer 114 is deposited and patterned (selectively formed) at block 208 by a suitable technique on a portion of the gate oxide layer 112 in a location that does not directly overly the isolation structure 108 and that is spaced a minimum distance 130 from the isolation structure 108 as shown in FIGS. 7A and 7B. Depending on the device scaling currently used and the safety margin desired the minimum distance chosen may be, for example, about 0.1 μm to 0.5 μm. A number of suitable gate layer formation processes can be employed, for example, a poly deposition, followed by a gate patterning, an etch, an etch clean, and a poly oxidation step.

It should be noted, that although the gate oxide layer 112 may still not grow uniformly near the STI structure 108, because the minimum distance 130 safely separates the gate oxide layer 112 from the STI structure 108, the gate will maintain a uniform oxide growth in the vicinity of the polysilicon gate layer 114. Thus the more critical gate stack area 115 is protected from charge loss by the method and structure of the present invention.

At 210 of method 200, a S/D dopant is patterned and implanted as illustrated in FIGS. 8A and 8B by a NSD/PSD dopant mask and implant in a S/D active region 110 in accordance with the present invention. These operations may be completed, for example, after NLDD/PLDD patterning and implanting the active regions in the n-well 106 and forming sidewall (S/W) spacers 118 and 120 (not shown in FIGS. 8A and 8B) on the gate poly 114. Then, at 210, the NSD/PSD mask defines the boundary of the S/D active region 110, and NSD/PSD dopants are implanted through an opening in the mask into portions of the n-well, the gate stack 115 and the isolation structure 108. Thus, the S/D active regions 110 together with the channel are defined and formed, while the dopants entering the isolation structure 108 have no effect. Note that in FIG. 8A, area 110 illustrates the opening defined by the source/drain mask, wherein the mask overlies everything except for the area within the box 110. Since the poly gate 114 blocks the source/drain dopant, the channel remains n-type in the above example.

Thereafter at 220 of method 200, the method ends wherein a memory device 100 (e.g., an EPROM, EEPROM, or another NVM device) is fabricated without utilizing an STI or another such structure to define the S/D regions, having a uniform gate oxide layer 112. Continued fabrication of the device can be performed including silicide strip and anneal, PMD nitride deposition, contact formation, metal layer formation, and the like.

Beneficially, the method 200 enables a gate oxide layer 112 to be formed uniformly providing a gate oxide layer thickness improvement of, for example, about 25%. For example, in one application the gate thickness was improved from 110 Angstrom to about 90 Angstroms, and in another application from 75 Angstroms to about 60 Angstroms.

Figure 9A:
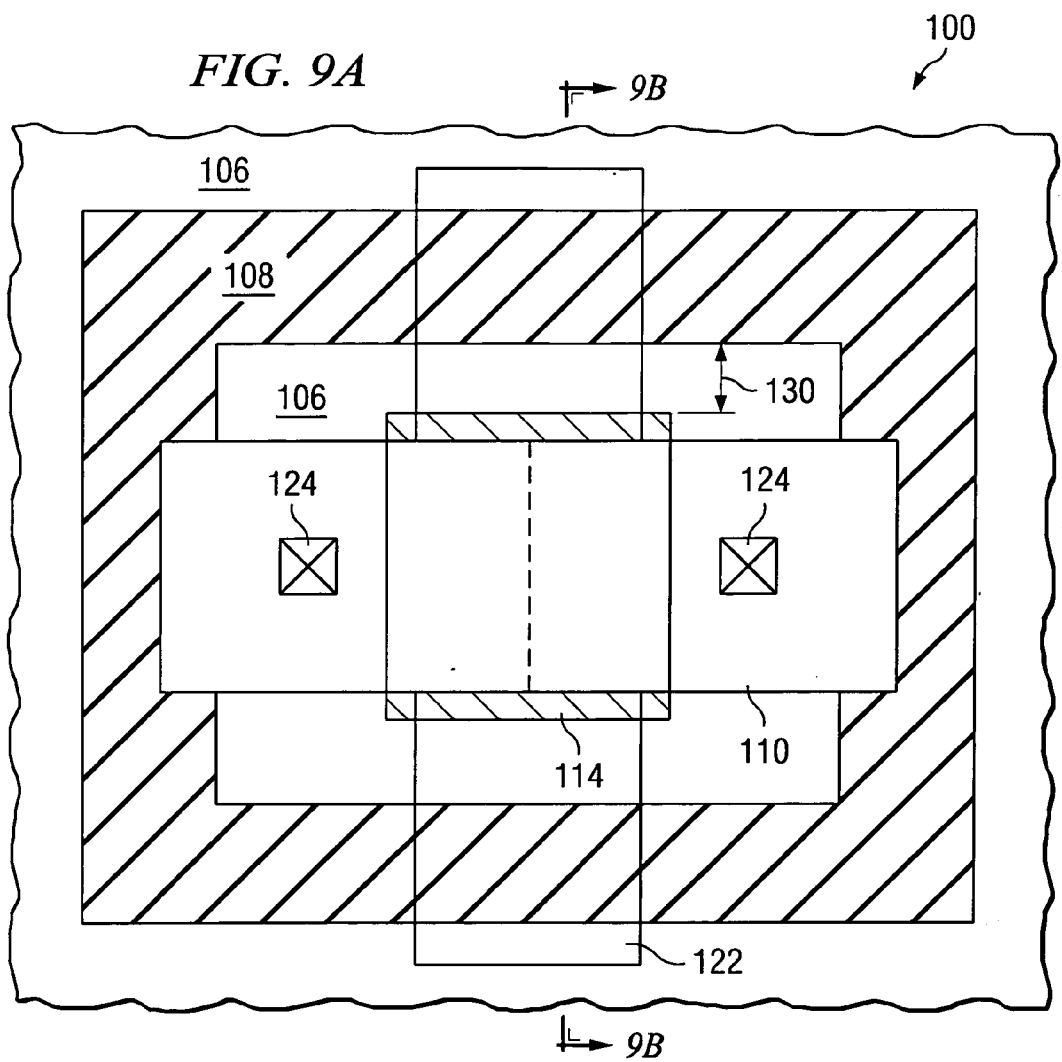
FIGS. 9A and 9B are top plan, and cross sectional side views, respectively, of the exemplary memory device of FIGS. 4A–4C after forming a silicide block layer and source/drain contacts.
Figure 9B:
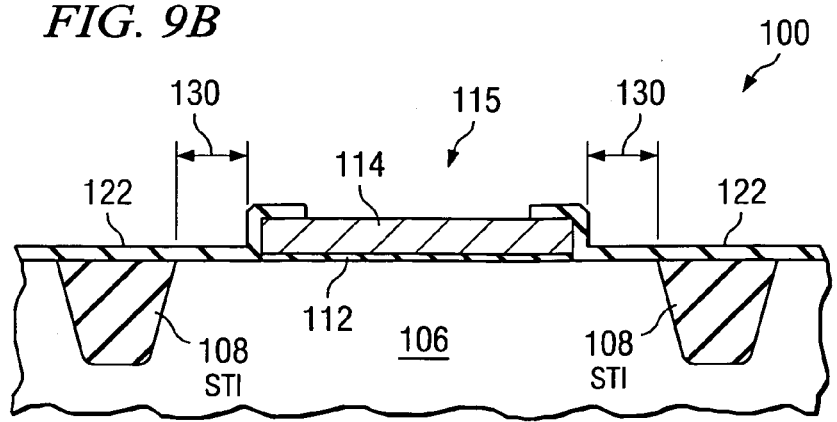

FIGS. 9A and 9B illustrate top plan, and cross sectional side views, respectively, of the exemplary memory device of FIGS. 4A–4C at a stage of fabrication after forming an optional additional step of applying a silicide block layer 122 and source/drain contacts 124 in accordance with an aspect of the present invention. The silicide block layer 122 may be utilized (e.g., via patterning and etching) to cover part or all of the active areas to prevent leakage between the source and drain regions 110 at the otherwise exposed surface of the device. Conductive contact pads 124 may also be formed over the S/D regions 110 to permit electrical connections to the memory device 100.

Figure 10:
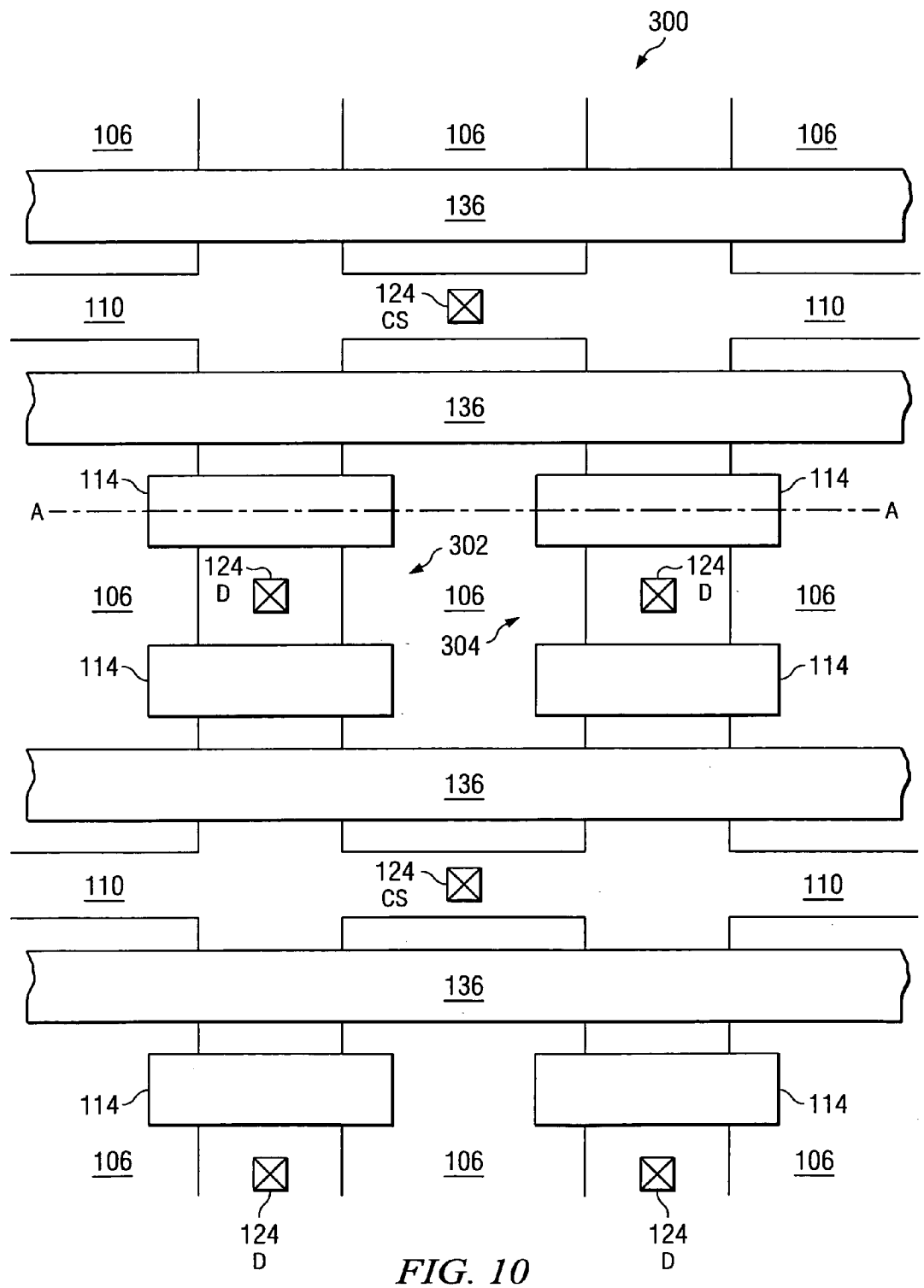
FIG. 10 is a partial top plan view illustrating several exemplary semiconductor memory devices in a common source arrangement for an OTP non-volatile memory device in accordance with an aspect of the present invention.

FIG. 10 illustrates a partial top plan view of several exemplary semiconductor memory devices in a common source arrangement for a non-volatile memory device 300 in accordance with an aspect of the present invention. NVM device 300, for example, illustrates six bits of an OTP EPROM array formed without an STI. The NVM array 300 of transistors such as 302 and 304 are formed in n-well regions 106 of a semiconductor substrate, having metal contacts 124 to common source (CS) and drain (D) connection points.

The transistors of NVM device 300 further comprise floating poly gates 114 over common source/drain regions CS/D 110, which are defined and formed into the transistors (e.g., 302 and 304) by patterning and implanting NSD/PSD dopants into portions of the gates 114, n-well regions 106 and CS/D active regions 110. Thus, the portions of the device 300 shown need no ST isolation structure, in accordance with the present invention, except to isolate portions of the periphery (not shown) of the NVM device 300. The device 300 further comprises poly select transistor lines 136 to select a specific row combination of the transistors of the array.

Figures 11, 12:
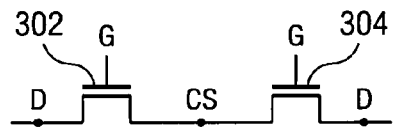
FIG. 11 is a schematic diagram illustrating the functional interconnection of the semiconductor memory devices of section A—A of FIG. 10 in accordance with an aspect of the present invention.
FIG. 12 is a chart illustrating the results of a performance comparison with and without the use of an STI for a semiconductor device fabricated in accordance with an aspect of the present invention.

FIG. 11 illustrates a schematic diagram of the functional interconnection of the semiconductor memory devices transistors 302 and 304 of section A—A of the NVM device 300 of FIG. 10 in accordance with an aspect of the present invention. FIG. 11 shows the sources connected together in a common source arrangement to provide a space efficient NVM memory design, without the use of an STI, LOCOS, FOX or another such isolation structure.

FIG. 12 illustrates a chart 400 of the results of a performance comparison with and without the use of an STI for a semiconductor device fabricated in accordance with an aspect of the present invention. Chart 400 shows median values of OTP EPROM drain current measured before and after programming comparing two different wafers of PMOS EPROM devices, one fabricated using an STI and the other fabricated without an STI. Essentially, the data appears to indicate there are no significant performance problems with the STI-less method.

It is appreciated that similar graphs and relationships can be obtained for other compositions and thicknesses to provide selected amounts of compression by protective liner layers in accordance with the present invention.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a semiconductor memory device comprising:

providing an active region of a semiconductor body of a first conductivity type;

forming a gate oxide layer on the active region of the semiconductor body;

forming and patterning a conductive gate layer overlying a portion of the gate oxide layer, wherein no portion of the conductive gate layer is formed overlying an isolation barrier; and patterning and implanting a second conductivity type dopant within a portion of the active region to define a source and drain region of the device with a channel extending therebetween in a channel length direction under the conductive gate layer, wherein the source and drain regions extend in a width direction generally orthogonal to the channel length direction, and wherein ends of the source and drain regions do not extend to the isolation barrier in the width direction.

2. The method of claim 1, further comprising:
forming a silicide block layer over portions of the active region to prevent leakage between the source and drain regions in a subsequent silicidation process.

3. The method of claim 2, wherein the silicide block layer is generally coincident with the conductive gate layer and extends in a width direction over the active region to the isolation barrier.

4. The method of claim 2, wherein the silicide block layer is formed generally perpendicular to the source and drain regions.

5. The method of claim 2, wherein the silicide block layer is formed generally aligned with a channel width.

6. The method of claim 1, further comprising:
patterning and implanting portions of the active region with dopants to form one of an NLDD and a PLDD extension regions of the second conductivity type; and
forming a sidewall spacer layer overlying sidewall portions of the conductive gate layer.

7. The method of claim 1, further comprising:
patterning and depositing metal contacts to the source and drain regions.

8. The method of claim 1, wherein the memory device comprises one of an OTP non-volatile memory device.

9. The method of claim 1, wherein the conductive gate layer is formed at least 0.1 μm from the isolation barrier in a width direction generally orthogonal to the channel length direction.

10. The method of claim 1, wherein the conductive gate layer is formed at least 0.5 μm from the isolation barrier in a width direction generally orthogonal to the channel length direction.

11. The method of claim 1, wherein the first conductivity type dopant comprises an n+ type dopant.

12. The method of claim 1, wherein the first conductivity type dopant comprises a p+ type dopant.

13. The method of claim 1, wherein the active region comprises a well in the substrate having an n+ type dopant.

14. The method of claim 1, wherein the active region comprises a well in the substrate having a p+ type dopant.

15. A method of fabricating a semiconductor memory device comprising:

providing an active region of a semiconductor body of a first conductivity type electrically isolated from other regions of the substrate by an isolation barrier;

forming a gate oxide layer on the active region of the substrate;

forming and patterning a conductive gate layer overlying a portion of the gate oxide layer, wherein no portion of the conductive gate layer is formed overlying the isolation barrier; and patterning and implanting a second conductivity type dopant within a portion of the active region to define a source and drain region of the device with a channel extending therebetween in a channel length direction under the conductive gate layer, wherein the source and drain regions extend in a width direction generally orthogonal to the channel length direction, and wherein ends of the source and drain regions do not extend to the isolation barrier in the width direction.

16. The method of claim 15, further comprising:
forming a silicide block layer over portions of the active region and the isolation barrier to prevent leakage between the source and drain regions in a subsequent silicidation process.

17. The method of claim 16, wherein the suicide block layer is generally coincident with the conductive gate layer and extends in a width direction over the active region to the isolation barrier.

18. The method of claim 16, wherein the silicide block layer is formed generally perpendicular to the source and drain regions.

19. The method of claim 16, wherein the silicide block layer is formed generally aligned with a channel width.

20. The method of claim 15, further comprising:
patterning and implanting portions of the active region with dopants to form one of an NLDD and a PLDD extension regions of the second conductivity type; and
forming a sidewall spacer layer overlying sidewall portions of the conductive gate layer.

* * * * *